(12) United States Patent
Hiner et al.

(10) Patent No.: US 9,230,883 B1
(45) Date of Patent: Jan. 5, 2016

(54) TRACE STACKING STRUCTURE AND METHOD

(75) Inventors: David Jon Hiner, Chandler, AZ (US);
Ronald Patrick Huemoeller, Gilbert, AZ (US); Harry Donald McCaleb, III, Litchfield Park, AZ (US); Michael Harry DeVita, Jr., Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 768 days.

(21) Appl. No.: 12/690,741

(22) Filed: Jan. 20, 2010

(51) Int. Cl.
*H01L 23/48* (2006.01)
(52) U.S. Cl.
CPC ..................................... *H01L 23/48* (2013.01)
(58) Field of Classification Search
CPC combination set(s) only.
See application file for complete search history.

(56) References Cited

U.S. PATENT DOCUMENTS

| | | | |
|---|---|---|---|
| 7,279,771 B2 | 10/2007 | Sunohara et al. | |
| 7,632,753 B1 | 12/2009 | Rusli et al. | |
| 7,951,697 B1* | 5/2011 | Huemoeller et al. | 438/597 |
| 2004/0155352 A1* | 8/2004 | Ma | 257/758 |
| 2004/0256715 A1 | 12/2004 | Seki | |
| 2007/0096328 A1 | 5/2007 | Takahashi et al. | |
| 2008/0122079 A1* | 5/2008 | Chen et al. | 257/737 |

* cited by examiner

*Primary Examiner* — Marvin Payen
(74) *Attorney, Agent, or Firm* — McAndrews, Held & Malloy

(57) ABSTRACT

A substrate includes a stacked trace formed from a trace and a first buildup trace stacked on the trace. The first buildup trace contacts and is electrically connected to the trace along the entire length of the trace. The current carrying cross-sectional area of the stacked trace is greater than the current carrying cross-sectional area of the trace. Accordingly, a plurality of the stacked traces can be formed with a small width and thus small pitch yet with a large current carrying cross-sectional area.

26 Claims, 9 Drawing Sheets

TRACE STACKING STRUCTURE AND METHOD

BACKGROUND OF THE INVENTION

1. Field of the Invention

The present application relates to the field of electronics, and more particularly, to methods of forming electronic component packages and related structures.

2. Description of the Related Art

A substrate includes an electrically conductive circuit having various electrically conductive features. These electrically conductive features include, for example, traces, vias, terminals, and bond fingers.

The traces of the circuit are long electrically conductive connectors that electrically connected the other features of the circuit. To form a high density circuit, the width and thus pitch of the traces is minimized. As the width of the traces is reduced, the cross-sectional area (the conductor volume) of the traces is reduced thus reducing the electrical performance of the traces. The cross-sectional area of a trace is sometimes called the current carrying cross-sectional area as it is the cross-sectional area of the trace across which the current conducted through the trace is carried.

To maintain the electrical performance of the traces while at the same time minimizing the width of the traces, the traces are formed from a high-grade electrically conductive material. The high-grade electrically conductive material is an extremely good electrical conductor allowing traces having reduced current carrying cross-sectional areas to nevertheless carry a sufficient current. However, forming the traces of the high-grade electrically conductive material is relatively expensive thus increasing the overall cost of substrate.

SUMMARY OF THE INVENTION

A substrate includes a stacked trace formed from a trace and a first buildup trace stacked on the trace. The first buildup trace contacts and is electrically connected to the trace along the entire length of the trace.

The stacked trace has a width equal to the width of the trace. Further, the stacked trace has a height equal to the height of the trace plus the height of the first buildup trace. Accordingly, the current carrying cross-sectional area of the stacked trace is greater than the current carrying cross-sectional area of the trace.

Accordingly, a plurality of the stacked traces can be formed with a small width and thus small pitch yet with a large current carrying cross-sectional area. In this manner, the stacked traces have high electrical performance while at the same time have a minimum width. Further, in one embodiment, the stacked traces are formed without use of an expensive high-grade electrically conductive material thus minimizing fabrication cost of the substrate.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 5:
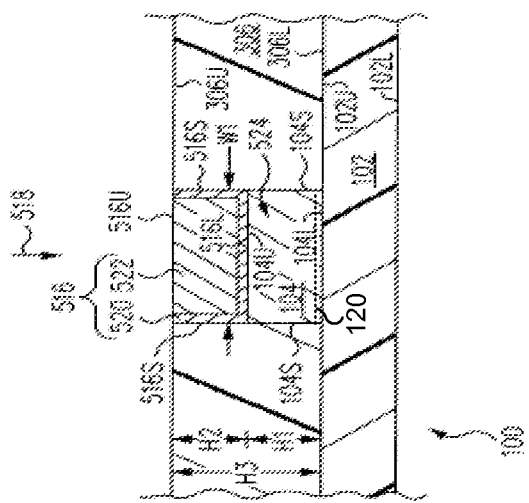
FIG. 5 is a cross-sectional view of the substrate of FIG. 4 at a later stage during fabrication in accordance with one embodiment.

As an overview, referring to FIG. 5, a substrate 100 includes a stacked trace 524 formed from a trace 104 and a first buildup trace 516 stacked on trace 104. First buildup trace 516 contacts and is electrically connected to trace 104 along the entire length of trace 104.

Stacked trace 524 has width W1 equal to width W1 of trace 104. Further, stacked trace 524 has a height H3 equal to height H1 of trace 104 plus height H2 of first buildup trace 516.

Accordingly, the current carrying cross-sectional area of stacked trace 524 is greater than the current carrying cross-sectional area of trace 104.

Accordingly, a plurality of stacked traces 524 can be formed with a small width W1 and thus small pitch yet with a large current carrying cross-sectional area. In this manner, stacked traces 524 have high electrical performance while at the same time have a minimum width W1. Further, in one embodiment, stacked traces 524 are formed without use of an expensive high-grade electrically conductive material thus minimizing fabrication cost of substrate 100.

Figure 2:
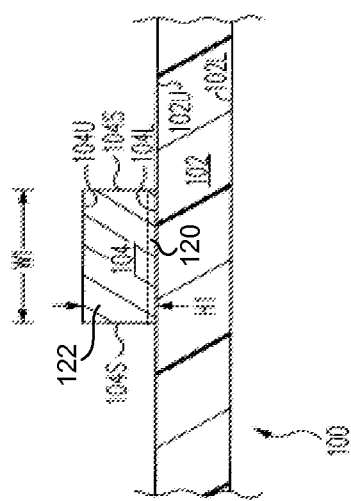
FIG. 2 is a cross-sectional view of the substrate of FIG. 1 along the line II-II in accordance with one embodiment.
Figure 1:
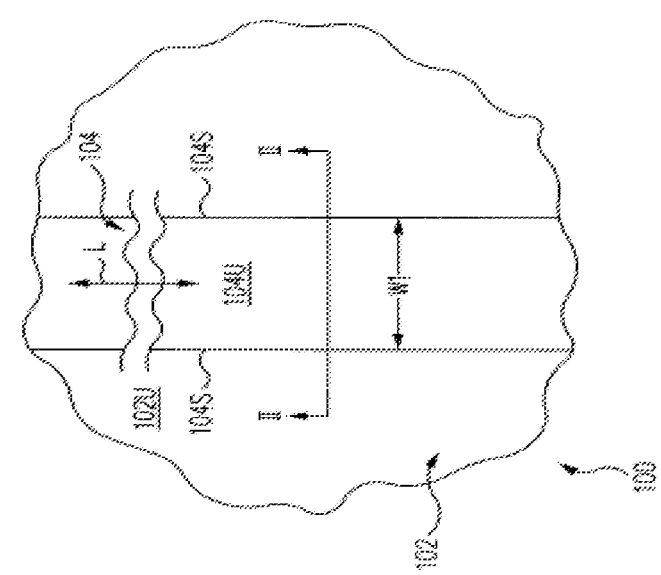
FIG. 1 is a top plan view of a substrate in accordance with one embodiment.

Now in more detail, FIG. 1 is a top plan view of a substrate 100 in accordance with one embodiment. FIG. 2 is a cross-sectional view of substrate 100 of FIG. 1 along the line II-II in accordance with one embodiment. Referring now to FIGS. 1 and 2 together, illustratively, substrate 100 is a substrate for use in an electronic component package. In another example, substrate 100 is a wafer having a plurality of electronic components, e.g., integrated circuits, formed therein.

In accordance with this embodiment, substrate 100 includes a dielectric layer 102, sometimes called a buildup film. Dielectric layer 102 is formed of a dielectric material and includes an upper, e.g., first, surface 102U and a lower, e.g., second, surface 102L.

Substrate 100 further includes a circuit including a trace 104 formed on upper surface 102U of dielectric layer 102. More particularly, a lower, e.g., first, surface 104L of trace 104 is in direct contact with upper surface 102U of dielectric layer 102. Trace 104 further includes an upper, e.g., second, surface 104U opposite lower surface 104L. Trace 104 further includes sides 104S extending between lower surface 104L and upper surface 104U.

Upper surface 102U, lower surface 102L, upper surface 104U, and lower surface 104L are parallel to one another. Further, sides 104S are perpendicular to upper surface 102U, lower surface 102L, upper surface 104U, and lower surface 104L. Although the terms parallel, perpendicular, and similar terms are used herein, it is to be understood that the described features may not be exactly parallel and perpendicular, but only substantially parallel and perpendicular to within excepted manufacturing tolerances.

Trace 104 is a long electrical conductor. More particularly, trace 104 has a width W1 between sides 104S and a length L. Trace 104 further includes a height H1 between upper surface 104U and lower surface 104L of trace 104. Illustratively, width W1 is ten (10) micrometers (μm) and height H1 is 15 μm, although these dimensions are simply illustrative and width W1 and height H1 have other dimensions in other embodiments.

Length L is many times greater than width W1 and height H1, e.g., five to hundreds and even thousands times greater depending upon particular design of the circuit. Length L extends in a longitudinal direction parallel to upper surface 102U, lower surface 102L, upper surface 104U, and lower surface 104L. Generally, trace 104 extends in the longitudinal direction to electrically interconnect other features of the circuit, for example, electrically connects vias, lands, bond fingers, or other features.

In one embodiment, an electrically conductive sheet is selectively etched to form trace 104, sometimes called a patterned trace.

In another embodiment, electrically conductive material is selectively deposited to form trace 104. For example, a full additive method is used to form trace 104 from a full build copper plating.

Further, although trace 104 is illustrated as a single layer, e.g., of copper, in other embodiments, trace 104 is formed of multiple layers of electrically conductive material. For example, trace 104 includes an electrically conductive seed layer 120, e.g., electroless or sputtered, and an electrically conductive plated layer 122 plated on the seed layer. For example a semi additive plating method (SAP) is used to form trace 104.

Figure 3:
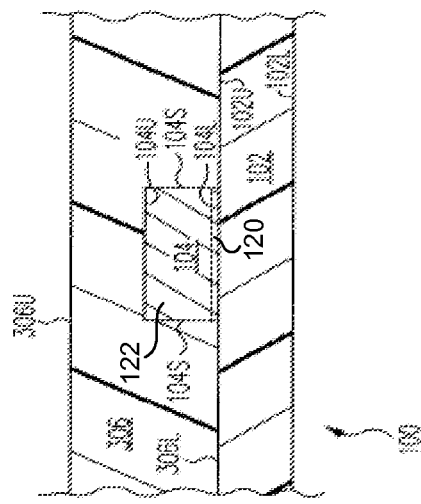
FIG. 3 is a cross-sectional view of the substrate of FIG. 2 at a later stage during fabrication in accordance with one embodiment.

FIG. 3 is a cross-sectional view of substrate 100 of FIG. 2 at a later stage during fabrication in accordance with one embodiment. Referring now to FIGS. 2 and 3 together, a first buildup dielectric layer 306 is applied to enclose trace 104 and upper surface 102U of dielectric layer 102. First buildup dielectric layer 306 contacts and completely encloses upper surface 104U and sides 104S of trace 104 and the exposed portions of upper surface 102U of dielectric layer 102.

In one embodiment, first buildup dielectric layer 306 is a cured liquid encapsulant, a film adhesive, molding compound, or other dielectric material. First buildup dielectric layer 306 includes a lower, e.g., first, surface 306L in contact with upper surface 102U of dielectric layer 102. First buildup dielectric layer 306 further includes an upper, e.g., second, surface 306U. Upper surface 306U is spaced above trace 104, i.e., upper surface 104U thereof, such that first buildup dielectric layer 306 exists between upper surface 306U and trace 104.

Figure 4:
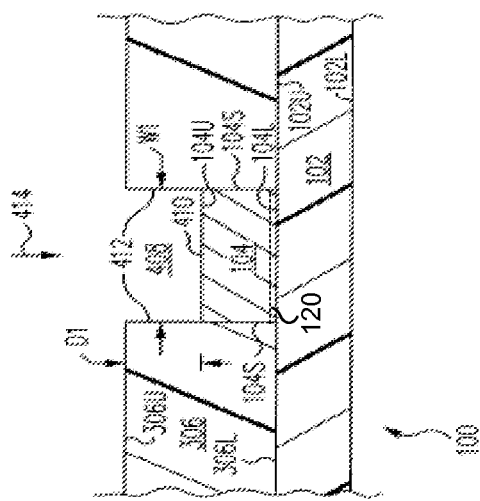
FIG. 4 is a cross-sectional view of the substrate of FIG. 3 at a later stage during fabrication in accordance with one embodiment.

FIG. 4 is a cross-sectional view of substrate 100 of FIG. 3 at a later stage during fabrication in accordance with one embodiment. Referring now to FIG. 4, a trace channel 408 is formed in first buildup dielectric layer 306.

Trace channel 408 is formed directly above trace 104 such that trace 104 is entirely exposed through trace channel 408. More particularly, trace channel 408 extends completely through first buildup dielectric layer 306 from upper surface 306U of first buildup dielectric layer 306 to upper surface 104U of trace 104.

Trace channel 408 includes a trace channel bottom 410 defined by upper surface 104U of trace 104. Trace channel 408 further includes trace channel sidewalls 412 extending between trace channel bottom 410 and upper surface 306U of first buildup dielectric layer 306. In accordance with this embodiment, trace channel sidewalls 412 are perpendicular to upper surface 104U of trace 104 and upper surface 306U of first buildup dielectric layer 306.

Trace channel 408 is the exact image of trace 104 when viewed from above in the direction of arrow 414. Trace channel 408 has width W1 between trace channel sidewalls 412 and a length L equal to width W1 and length L (see FIG. 1) of trace 104. Further, trace channel 408 has a depth D1 equal to the distance between upper surface 104U of trace 104 and upper surface 306U of first buildup dielectric layer 306.

In one embodiment, trace channel 408 is formed by selective removal of first buildup dielectric layer 306. For example, a mask is applied to first buildup dielectric layer 306 and patterned to expose the portion of first buildup dielectric layer 306 above trace 104. The exposed portion of first buildup dielectric layer 306 is then removed and the mask is stripped.

In another embodiment, trace channel 408 is formed using a laser-ablation process. More particularly, a laser is directed at upper surface 306U of first buildup dielectric layer 306 perpendicularly to upper surface 306U. This laser ablates, i.e., removes, a portion of first buildup dielectric layer 306 leaving trace channel 408, sometimes called a laser trench.

Although a selective removal process and a laser-ablation process for formation of trace channel 408 is set forth above, in other embodiments, other trace channel formation techniques are used. For example, trace channel 408 is formed using selective molding, milling, mechanical drilling, high pressure water drilling, burning, honing, grinding, electro discharge machining, chemical etching and/or other trace channel formation techniques.

FIG. 5 is a cross-sectional view of substrate 100 of FIG. 4 at a later stage during fabrication in accordance with one embodiment. Referring now to FIGS. 4 and 5 together, trace channel 408 is filled with an electrically conductive first buildup trace 516.

First buildup trace 516 includes a lower, e.g., first, surface 516L. Lower surface 516L of first buildup trace 516 is identical to upper surface 104U of trace 104 and is formed thereon. Generally, first buildup trace 516 is identical to trace 104. Although the term identical is used herein to describe relationships between various features, in light of this disclosure, those of skill in the art will understand that the features may not be exactly identical, but that there may be small variations between the features. For example, due to manufacturing tolerances, e.g., in a laser-ablation or imaging process, a buildup trace may be slightly offset from the underlying trace on which the buildup trace is stacked.

First buildup trace 516 further includes an upper, e.g., second, surface 516U. Upper surface 516U is parallel to and coplanar with upper surface 306U of first buildup dielectric layer 306. In another embodiment, upper surface 516U is slightly recessed below upper surface 306U of first buildup dielectric layer 306 to avoid shorting between adjacent traces. First buildup trace 516 further includes sides 516S extending perpendicularly between upper surface 516U and lower surface 516L.

First buildup trace 516 is the exact image of trace 104 when viewed from above in the direction of arrow 518. First buildup trace 516 has width W1 between sides 516S and a length L equal to width W1 and length L (see FIG. 1) of trace 104. Further, first buildup trace 516 has a height H2 between upper surface 516U and lower surface 516L of first buildup trace 516.

In accordance with this embodiment, first buildup trace 516 is a bilayer structure including an electrically conductive seed layer 520 and a plated layer 522 formed using a semi-additive method. Illustratively, seed layer 520 is blanket formed, e.g., using electroless plating or sputtering, in trace channel 408 and on upper surface 306U of first buildup dielectric layer 306. Seed layer 520 is then used, e.g., as an electrode, for plating of plated layer 522. The portion of seed layer 520 and plated layer 522 on upper surface 306U of first buildup dielectric layer 306 is then removed leaving seed layer 520 and plated layer 522 in trace channel 408 as illustrated.

In another embodiment, first buildup dielectric layer 306 is a laser activated dielectric material. Trace channel 408 is formed simultaneously with seed layer 520 using a laser-ablation process. More particularly, the energy from the laser ablates dielectric layer 306 forming trace channel 408 while at the same time laser activates dielectric layer 306 forming seed layer 520. For more information on laser activated dielectric materials, see Rusli et al., U.S. Pat. No. 7,632,753, entitled "WAFER LEVEL PACKAGE UTILIZING LASER-ACTIVATED DIELECTRIC MATERIAL", issued Dec. 15, 2009, which is herein incorporated by reference in its entirety.

Although first buildup trace 516 is illustrated in FIG. 5 and discussed above as including a bilayer structure formed of seed layer 520 and plated layer 522, in other embodiments, first buildup trace 516 is formed of a single material such as copper. For example, copper is plated on trace 104 to fill trace channel 408 thus forming first buildup trace 516 using a full-additive method.

As set forth above, first buildup trace 516 contacts and is electrically connected to trace 104 along the entire length L of trace 104. Accordingly, first buildup trace 516 and trace 104 collectively form a stacked trace 524.

Stacked trace 524 has width W1 equal to width W1 of trace 104. Further, stacked trace 524 has a height H3 equal to height H1 of trace 104 plus height H2 of first buildup trace 516. Accordingly, the current carrying cross-sectional area of stacked trace 524 equals width W1 times height H3. This current carrying cross-sectional area of stacked trace 524 is greater than the current carrying cross-sectional area (width W1 times height H1) of trace 104. In one embodiment, stacked trace 524 is used in a power demanding application in which a large current is carried by stacked trace 524.

Although a single stacked trace 524 is illustrated and discussed above, in light of this disclosure, those of skill in the art will understand that a plurality of stacked traces 524 are fabricated simultaneously in a similar manner to form a circuit of substrate 100.

The cross-sectional area of a trace is sometimes called the current carrying cross-sectional area as it is the cross-sectional area of the trace across which the current conducted through the trace is carried. For a given material, e.g. copper, a trace having a greater current carrying cross-sectional area and thus greater conductive metal volume will have better electrical performance, e.g., reduced impedance, than a trace having a smaller current carrying cross-sectional area and thus smaller conductive metal volume.

As set forth above, stacked trace 524 has a greater current carrying cross-sectional area than trace 104 yet has the same width W1 as trace 104. Accordingly, a plurality of stacked traces 524 can be formed with a small width W1 and thus small pitch yet with a large current carrying cross-sectional area. In this manner, stacked traces 524 have high electrical performance while at the same time have a minimum width W1. Further, in one embodiment, stacked traces 524 are formed without use of an expensive high-grade electrically conductive material thus minimizing fabrication cost of substrate 100.

Further, although stacked trace 524 is illustrated in FIG. 5 and discussed above as including first buildup trace 516 stacked on trace 104, i.e., as including two stacked traces, in other embodiments, the process described above is repeated to stack additional buildup traces on first buildup trace 516.

Illustratively, an additional buildup dielectric layer is applied to upper surface 306U of first buildup dielectric layer 306 and to upper surface 516U of first buildup trace 516. A trace channel is formed in the additional buildup dielectric layer to expose first buildup trace 516. The trace channel is filled with electrically conductive material to form an additional buildup trace in direct contact with and electrically connected to first buildup trace 516. This process is repeated as desired to stack additional traces on first buildup trace 516.

Further still, although stacked trace 524 is discussed above as a small width high performance electrical conductor, stacked trace 524 can also be used to shield an electronic component or trace structure from electromagnetic interference in a manner similar to that discussed below regarding FIGS. 17-20. Generally, any of the stacked traces as set forth herein can be used as an electrical conductor, as a shielding structure, or both as an electrical conductor and as a shielding structure.

Figure 6:
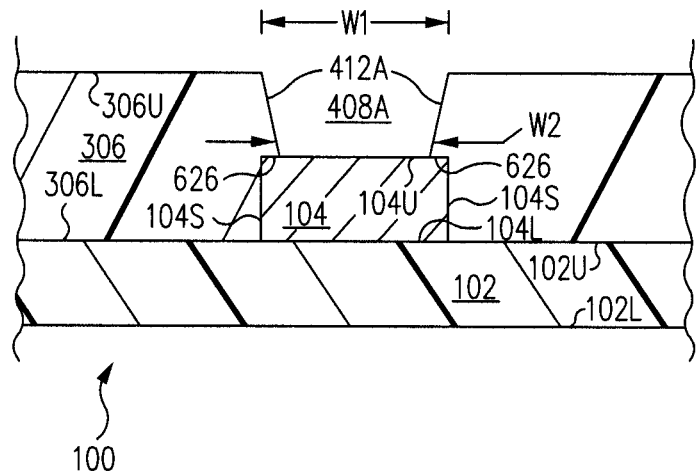
FIG. 6 is a cross-sectional view of the substrate of FIG. 3 at a later stage during fabrication in accordance with another embodiment.

FIG. 6 is a cross-sectional view of substrate 100 of FIG. 3 at a later stage during fabrication in accordance with another embodiment. Substrate 100 at the stage illustrated in FIG. 6 is similar to substrate 100 at the stage illustrated in FIG. 4 and only the significant differences are discussed below.

In accordance with this embodiment, a trace channel 408A is formed in first buildup dielectric layer 306 in a manner similar to the formation of trace channel 408 of FIG. 4. However, in accordance with this embodiment, trace channel 408A includes tapered trace channel sidewalls 412A as is typical with laser ablation. More particularly, trace channel 408A tapers between width W1 between tapered trace channel sidewalls 412A at upper surface 306U and a width W2 between tapered trace channel sidewalls 412A at upper surface 104U of trace 104. Width W1 is greater than width W2.

As trace channel 408A has width W2 at upper surface 104U of trace 104, small covered portions 626 of upper surface 104U of trace 104 are not exposed through trace channel 408A but remain covered by first buildup dielectric layer 306.

Figure 7:
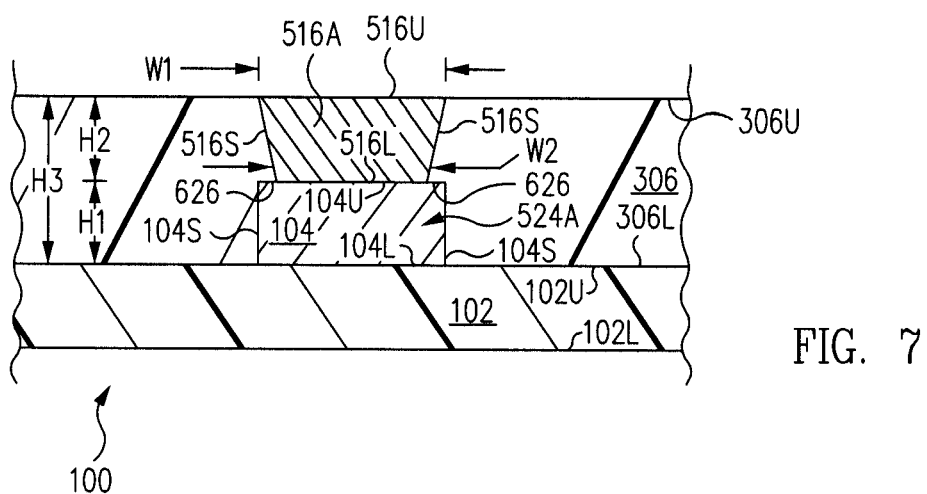
FIG. 7 is a cross-sectional view of the substrate of FIG. 6 at a later stage during fabrication in accordance with one embodiment.

FIG. 7 is a cross-sectional view of substrate 100 of FIG. 6 at a later stage during fabrication in accordance with one embodiment. Substrate 100 at the stage illustrated in FIG. 7 is similar to substrate 100 at the stage illustrated in FIG. 5 and only the significant differences are discussed below.

Referring now to FIGS. 6 and 7 together, trace channel 408A is filled with an electrically conductive first buildup trace 516A in a manner similar to the filling of trace channel 408 with first buildup trace 516 of FIG. 5. However, in accordance with this embodiment, first buildup trace 516A includes tapered sides 516S. More particularly, first buildup trace 516A tapers between width W1 between tapered sides 516S at upper surface 516U and width W2 between tapered sides 516S at lower surface 516L of first buildup trace 516A. Width W1 is greater than width W2.

As first buildup trace 516A has width W2 at upper surface 104U of trace 104 whereas trace 104 has the greater width W1, small covered portions 626 of upper surface 104U of trace 104 are not in direct contact with first buildup trace 516A but remain covered by first buildup dielectric layer 306. However, for all practical purposes, there is a negligible loss of electrical performance due to the fact that first buildup trace 516A tapers and lacks contact with small covered portions 626 of upper surface 104U of trace 104 as compared to first buildup trace 516 of FIG. 5.

Further, first buildup trace 516A is illustrated in FIG. 7 as being formed of a single layer conductor, e.g., copper, although is formed of two or more layers similar to first buildup trace 516 of FIG. 5 in other embodiments. First buildup trace 516A and trace 104 form a stacked trace 524A.

Figure 8:
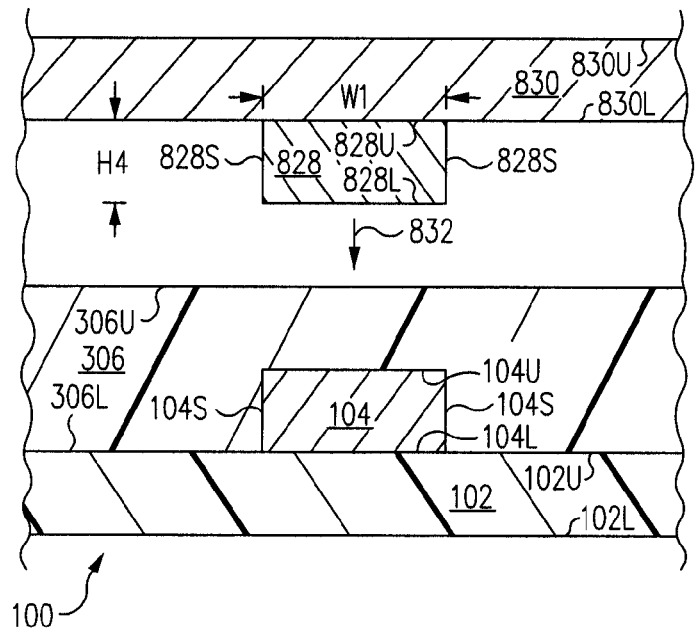
FIG. 8 is a cross-sectional view of the substrate of FIG. 3 at a later stage during fabrication in accordance with yet another embodiment.

FIG. 8 is a cross-sectional view of substrate 100 of FIG. 3 at a later stage during fabrication in accordance with yet another embodiment. Referring now to FIG. 8, a first buildup trace 828 is formed on a carrier 830.

Carrier 830 includes a lower, e.g., first, surface 830L and upper, e.g., second, surface 830U. First buildup trace 828 includes a lower, e.g., first, surface 828L and an upper, e.g., second, surface 828U. Upper surface 828U of first buildup trace 828 is formed on lower surface 830L of carrier 830. In one embodiment, first buildup trace 828 is selectively plated on carrier 830 although is formed using other techniques in other embodiments. First buildup trace 828 further includes sides 828S extending perpendicularly (or tapered) between upper surface 828U and lower surface 828L.

Lower surface 828L of first buildup trace 828 is essentially identical to upper surface 104U of trace 104. State another way, first buildup trace 828 is the exact image of trace 104 when viewed from above in the direction of arrow 832. First buildup trace 828 has width W1 between sides 828S and a length L equal to width W1 and length L (see FIG. 1) of trace 104, respectively. Further, first buildup trace 828 has a height H4 between upper surface 828U and lower surface 828L of first buildup trace 828.

Carrier 830 and first buildup trace 828 are moved in the direction of arrow 832 and pressed into upper surface 306U of first buildup dielectric layer 306 to transfer embed first buildup trace 828 into first buildup dielectric layer 306. In one embodiment, the assembly is heated while carrier 830 and first buildup trace 828 are pressed into upper surface 306U of first buildup dielectric layer 306 to cause buildup dielectric layer 306 to flow around and encase first buildup trace 828 as illustrated in FIG. 9.

Figure 9:
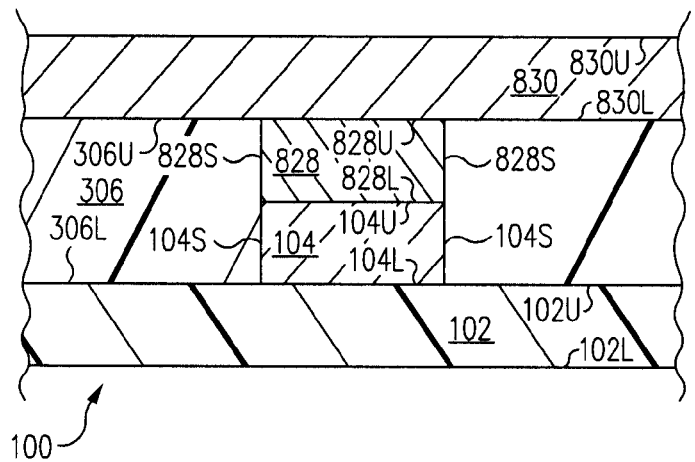
FIG. 9 is a cross-sectional view of the substrate of FIG. 8 at a later stage during fabrication in accordance with one embodiment.

FIG. 9 is a cross-sectional view of substrate 100 of FIG. 8 at a later stage during fabrication in accordance with one embodiment. Referring now to FIGS. 8 and 9 together, carrier 830 and first buildup trace 828 are laminated into upper surface 306U of first buildup dielectric layer 306. First buildup dielectric layer 306 directly contacts and encloses sides 828S of first buildup trace 828. Further, first buildup dielectric layer 306 directly contacts and encloses lower surface 830L of carrier 830. First buildup dielectric layer 306 is cured in one embodiment.

Lower surface 828L of first buildup trace 828 is pressed entirely through first buildup dielectric layer 306 to contact upper surface 104U of trace 104. Accordingly, first buildup trace 828 is electrically connected to and stacked on trace 104.

Figure 10:
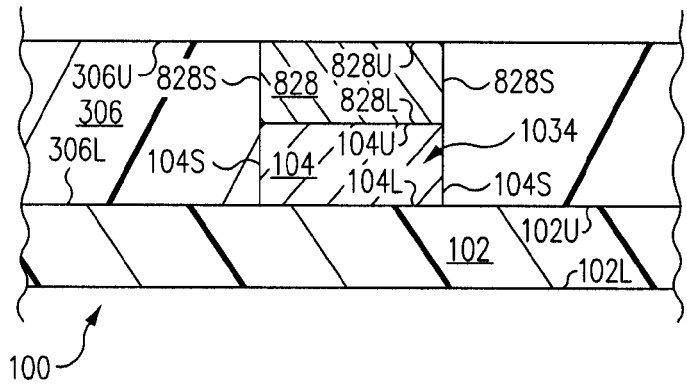
FIG. 10 is a cross-sectional view of the substrate of FIG. 9 at a later stage during fabrication in accordance with one embodiment.

FIG. 10 is a cross-sectional view of substrate 100 of FIG. 9 at a later stage during fabrication in accordance with one embodiment. Referring now to FIGS. 9 and 10 together, carrier 830 is removed, e.g., by etching. After removal of carrier 830, first buildup trace 828 remains embedded within first buildup dielectric layer 306 and on trace 104. More particularly, upper surface 828U is parallel to and coplanar with upper surface 306U of first buildup dielectric layer 306. First buildup trace 828 and trace 104 collectively form a stacked trace 1034.

Figure 11A:
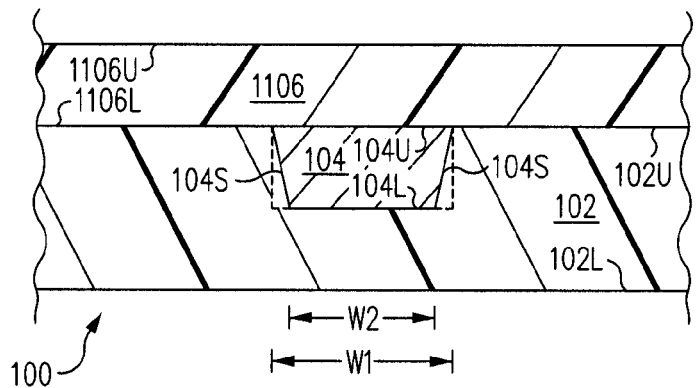
FIG. 11A is a cross-sectional view of the substrate of FIG. 1 along the line II-II in accordance with another embodiment.

FIG. 11A is a cross-sectional view of substrate 100 of FIG. 1 along the line II-II in accordance with another embodiment. Substrate 100 in the embodiment illustrated in FIG. 11A is similar to substrate 100 in the embodiment illustrated in FIG. 2 except that trace 104 is embedded within dielectric layer 102 in accordance with the embodiment illustrated in FIG. 11A.

More particularly, referring now to FIG. 11A, trace 104 is embedded into upper surface 102U of dielectric layer 102. Lower surface 104L of trace 104 is below upper surface 102U of dielectric layer 102. Specifically, lower surface 104L of trace 104 is between upper surface 102U and lower surface 102L of dielectric layer 102 such that a portion of dielectric layer 102 exists between lower surface 104L of trace 104 and lower surface 102L of dielectric layer 102.

In accordance with this embodiment, upper surface 104U of trace 104 is parallel to and coplanar with upper surface 102U of dielectric layer 102. In another embodiment, upper surface 104U is slightly recessed below upper surface 102U of dielectric layer 102 to avoid shorting between adjacent traces.

Dielectric layer 102 further encloses sides 104S of trace 104. In accordance with this embodiment, sides 104S are tapered. More particularly, trace 104 tapers between a width W1 between sides 104S at upper surface 104U and a width W2 between sides 104S at lower surface 104L of trace 104. Width W1 is greater than width W2.

However, in another embodiment as indicated by the dashed lines in FIG. 11A, sides 104S of trace 104 are perpendicular to upper surface 102U, lower surface 102L, upper surface 104U, and lower surface 104L. In the following FIGS. 11B, 12, 13, 13A, 14, 15, and 16, sides 104S are illustrated as tapering. However, it is to be understood that sides 104S are perpendicular in the embodiments illustrated FIGS. 11B, 12, 13, 13A, 14, 15, and 16 as indicated by the dashed lines in FIG. 11A in other examples.

Trace 104 is formed within dielectric layer 102 using any one of a number of techniques, the particular technique used is not essential to this embodiment. To illustrate, a trace channel is made, e.g., using laser ablation, in dielectric layer 102 in a manner similar to that set forth above regarding formation of trace channel 408 or trace channel 408A of FIGS. 4, 6, respectively. The trace channel in dielectric layer 102 is filled to form trace 104 in a manner similar to that set forth above regarding formation of first buildup trace 516 or first buildup trace 516A of FIGS. 5, 7, respectively. In accordance with one embodiment, trace 104 is a laser embedded (LECS) trace.

In another embodiment, trace 104 is transfer embedded into dielectric layer 102 in a manner similar to the transfer embedding of first buildup trace 828 into first buildup dielectric layer 306 as described above in reference to FIGS. 8, 9, and 10. In accordance with this embodiment, trace 104 is a transfer embedded trace (TECS).

After formation of trace 104 in dielectric layer 102, a first buildup dielectric layer 1106 is applied to, contacts, and completely encloses upper surface 102U of dielectric layer 102 and upper surface 104U of trace 104.

In one embodiment, first buildup dielectric layer 1106 is a cured liquid encapsulant, a film adhesive, molding compound, or other dielectric material. First buildup dielectric layer 1106 includes a lower, e.g., first, surface 1106L in contact with upper surface 102U of dielectric layer 102 and upper surface 104U of trace 104. First buildup dielectric layer 1106 further includes an upper, e.g., second, surface 1106U.

Figure 11B:
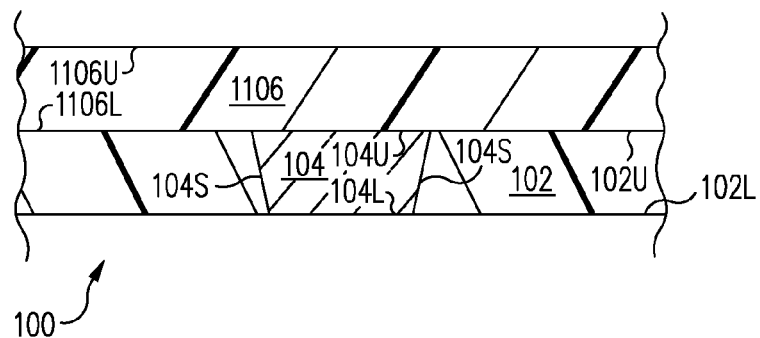
FIG. 11B is a cross-sectional view of the substrate of FIG. 1 along the line II-II in accordance with another embodiment.

FIG. 11B is a cross-sectional view of substrate 100 of FIG. 1 along the line II-II in accordance with another embodiment. Substrate 100 of FIG. 11B is similar to substrate 100 of FIG. 11A except that trace 104 extends entirely through dielectric layer 102 in FIG. 11B. More particularly, lower surface 104L is parallel to and coplanar with lower surface 102L of dielectric layer 102. Sides 104S (tapered or perpendicular) extend between upper surface 102U and lower surface 102L of dielectric layer 102 in accordance with this embodiment. Trace 104 is formed in a manner similar to that discussed above regarding formation of trace 104 as illustrated in FIG. 11A.

By exposing trace 104 at lower surface 102L of dielectric layer 102, electrical interconnection of trace 104 to structures such as electrically conductive planes and traces on lower surface 102L of dielectric layer 102 is facilitated. In the following FIGS. 12, 13, 13A, 14, 15, and 16, trace 104 only partially extends into dielectric layer 102 as illustrated in FIG. 11A. However, it is to be understood that the discussion is equally applicable to trace 104 in the case when trace 104 completely extends across dielectric layer 102 as illustrated in FIG. 11B.

Figure 12:
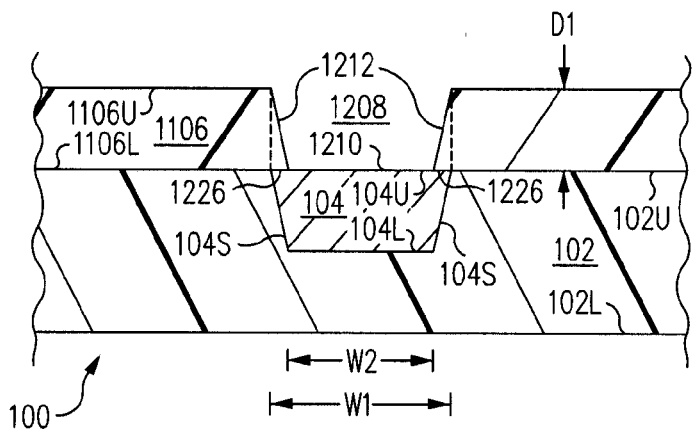
FIG. 12 is a cross-sectional view of the substrate of FIG. 11A at a later stage during fabrication in accordance with one embodiment.

FIG. 12 is a cross-sectional view of substrate 100 of FIG. 11A at a later stage during fabrication in accordance with one embodiment. Referring now to FIG. 12, a trace channel 1208 is formed in first buildup dielectric layer 1106.

Trace channel 1208 is formed directly above trace 104 such that trace 104 is exposed through trace channel 1208. More particularly, trace channel 1208 extends completely through first buildup dielectric layer 1106 from upper surface 1106U of first buildup dielectric layer 1106 to lower surface 1106L of first buildup dielectric layer 1106.

Trace channel 1208 includes a trace channel bottom 1210 defined by upper surface 104U of trace 104. Trace channel 1208 further includes trace channel sidewalls 1212 extending between trace channel bottom 1210 and upper surface 1106U of first buildup dielectric layer 1106.

In one embodiment, trace channel 1208 tapers between a width W1 between trace channel sidewalls 1212 at upper surface 1106U and a width W2 between trace channel sidewalls 1212 at upper surface 104U of trace 104. Width W1 is greater than width W2.

As trace channel 1208 has width W2 at upper surface 104U of trace 104, small covered portions 1226 of upper surface 104U of trace 104 are not exposed through trace channel 1208 but remain covered by first buildup dielectric layer 1106.

However, in another embodiment as indicated by the dashed lines, trace channel sidewalls 1212 of trace channel 1208 are perpendicular to upper surface 1106U, lower surface 1106L, and upper surface 104U. In accordance with this embodiment, trace channel 1208 is the exact image of trace 104 when viewed from above. Trace channel 1208 has width W1 between trace channel sidewalls 1212 and a length L equal to width W1 and length L (see FIG. 1) of trace 104. Further, trace channel 1208 has a depth D1 equal to the distance (thickness) of first buildup dielectric layer 1106 between upper surface 1106U and lower surface 1106L of first buildup dielectric layer 1106.

In the following FIGS. 13, 13A, trace channel sidewalls 1212 are illustrated as tapering. However, it is to be understood that trace channel sidewalls 1212 are perpendicular as indicated by the dashed lines in FIG. 12 in other embodiments.

In one embodiment, trace channel 1208 is formed by selective removal of first buildup dielectric layer 1106. For example, a mask is applied to first buildup dielectric layer 1106 and pattern to expose the portion of first buildup dielectric layer 1106 above trace 104. The exposed portion of first buildup dielectric layer 1106 is then removed and the mask is stripped.

In another embodiment, trace channel 1208 is formed using a laser-ablation process. More particularly, a laser is directed at upper surface 1106U of first buildup dielectric layer 1106 perpendicularly to upper surface 1106U. This laser ablates, i.e., removes, a portion of first buildup dielectric layer 1106 leaving trace channel 1208.

Although a selective removal process and a laser-ablation process for formation of trace channel 1208 is set forth above, in other embodiments, other trace channel formation techniques are used. For example, trace channel 1208 is formed using selective molding, milling, mechanical drilling, high pressure water drilling, burning, honing, grinding, electro discharge machining, chemical etching and/or other trace channel formation techniques.

Figure 13:
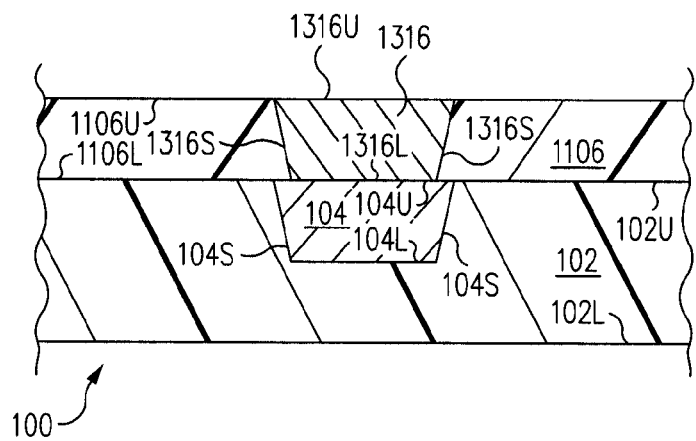
FIG. 13 is a cross-sectional view of the substrate of FIG. 12 at a later stage during fabrication in accordance with one embodiment.

FIG. 13 is a cross-sectional view of substrate 100 of FIG. 12 at a later stage during fabrication in accordance with one embodiment. Referring now to FIGS. 12 and 13 together, trace channel 1208 is filled with an electrically conductive first buildup trace 1316.

First buildup trace 1316 includes a lower, e.g., first, surface 1316L. Lower surface 1316L of first buildup trace 1316 is essentially identical (slightly narrower if first buildup trace 1316 is tapered) to upper surface 104U of trace 104 and is formed thereon.

First buildup trace 1316 further includes an upper, e.g., second, surface 1316U. Upper surface 1316U is parallel to and coplanar with upper surface 1106U of first buildup dielectric layer 1106. In another embodiment, upper surface 1316U is slightly recessed below upper surface 1106U of first buildup dielectric layer 1106 to avoid shorting between adjacent traces.

First buildup trace 1316 further includes sides 1316S extending (tapered or perpendicularly depending upon the embodiment) between upper surface 1316U and lower surface 1316L. First buildup trace 1316 is formed in trace channel 1208 in a manner similar to the formation of first buildup trace 516 or first buildup trace 516A as described above in reference to FIGS. 5, 7, respectively.

Figure 13A:
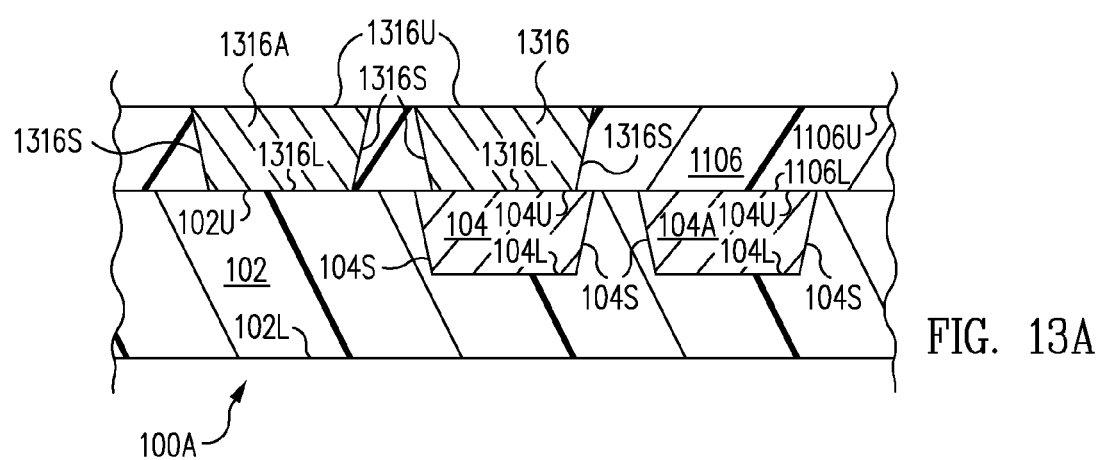
FIG. 13A is a cross-sectional view of a substrate in accordance with another embodiment.

FIG. 13A is a cross-sectional view of a substrate 100A in accordance with another embodiment. Substrate 100A of FIG. 13A is similar to substrate 100 of FIG. 13 except that substrate 100A includes unstacked traces 104A and 1316A. More particularly, unstacked trace 104A is formed in dielectric layer 102 in a manner similar to that discussed above regarding trace 104. Trace 104A includes upper surface 104U, lower surface 104L, and sides 104S similar to upper surface 104U, lower surface 104L, and sides 104S of trace 104.

Further, unstacked trace 1316A is formed in first buildup dielectric layer 1106 in a manner similar to that discussed above regarding trace 1316. Trace 1316A includes upper surface 1316U, lower surface 1316L, and sides 1316S similar to upper surface 1316U, lower surface 1316L, and sides 1316S of trace 1316.

FIG. 13A illustrates that some traces, e.g., traces 104, 1316 can be stacked whereas other traces, e.g., traces 104A, 1316A, can be formed in various layers, e.g., dielectric layer 102 and first buildup dielectric layer 1106, and are unstacked. Although a particular example is set forth in FIG. 13A, in light of this disclosure, those of skill in the art will understand that unstacked traces can be formed in any of the other embodiments set forth herein in a similar manner.

Figure 14:
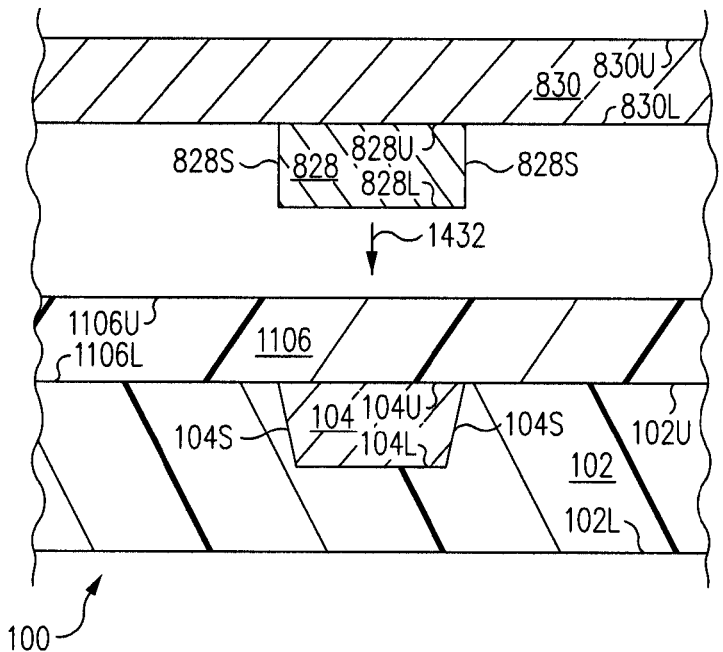
FIG. 14 is a cross-sectional view of the substrate of FIG. 11A at a later stage during fabrication in accordance with yet another embodiment.

FIG. 14 is a cross-sectional view of substrate 100 of FIG. 11A at a later stage during fabrication in accordance with yet another embodiment. Referring now to FIG. 14, a first buildup trace 828 is formed on a carrier 830. First buildup trace 828 and carrier 830 as illustrated in FIG. 14 are similar or identical to first buildup trace 828 and carrier 830 as illustrated in FIG. 8 and discussed above.

Carrier 830 and first buildup trace 828 are moved in the direction of arrow 1432 and pressed into upper surface 1106U of first buildup dielectric layer 1106 to transfer embed first buildup trace 828 into first buildup dielectric layer 1106. In one embodiment, the assembly is heated while carrier 830 and first buildup trace 828 are pressed into upper surface 1106U of first buildup dielectric layer 1106 to cause buildup dielectric layer 1106 to flow around and encase first buildup trace 828 as illustrated FIG. 15.

Figure 15:
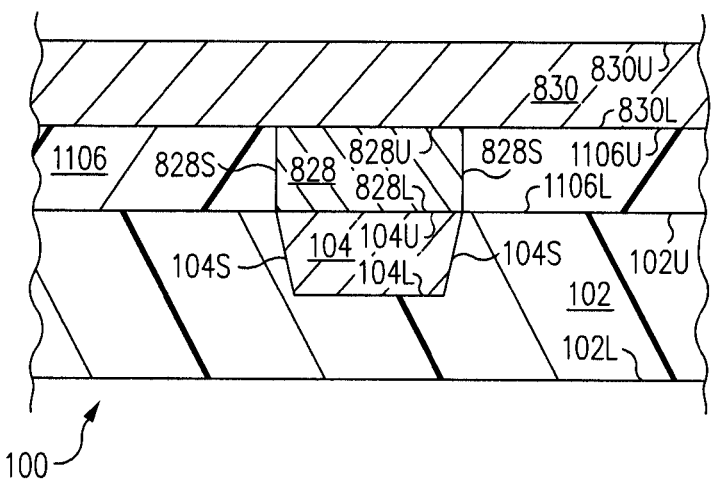
FIG. 15 is a cross-sectional view of the substrate of FIG. 14 at a later stage during fabrication in accordance with one embodiment.

FIG. 15 is a cross-sectional view of substrate 100 of FIG. 14 at a later stage during fabrication in accordance with one embodiment. Referring now to FIGS. 14 and 15 together, carrier 830 and first buildup trace 828 are laminated into upper surface 1106U of first buildup dielectric layer 1106. First buildup dielectric layer 1106 directly contacts and encloses sides 828S of first buildup trace 828. Further, first buildup dielectric layer 1106 contacts and encloses lower surface 830L of carrier 830. First buildup dielectric layer 1106 is cured in one embodiment.

Lower surface 828L of first buildup trace 828 is pressed entirely through first buildup dielectric layer 1106 to contact upper surface 104U of trace 104. Accordingly, first buildup trace 828 is electrically connected to trace 104.

Figure 16:
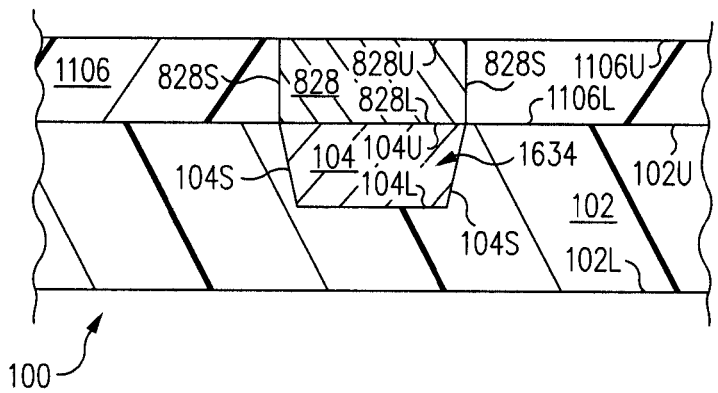
FIG. 16 is a cross-sectional view of the substrate of FIG. 15 at a later stage during fabrication in accordance with one embodiment.

FIG. 16 is a cross-sectional view of substrate 100 of FIG. 15 at a later stage during fabrication in accordance with one embodiment. Referring now to FIGS. 15 and 16 together, carrier 830 is removed, e.g., by etching. After removal of carrier 830, first buildup trace 828 remains embedded within first buildup dielectric layer 1106 and on trace 104. More particularly, upper surface 828U is parallel to and coplanar with upper surface 1106U of first buildup dielectric layer 1106. First buildup trace 828 and trace 104 collectively form a stacked trace 1634.

Although various examples of stacking of traces to form a stacked trace are set forth above, generally, a first trace is formed using a process selected from the group including: laser embedded (LECS); transfer embedded (TECS); semi additive (SAP, also called MSAP), e.g., electro less seed, sputter, laser activated dielectrics; full additive, e.g., full build copper plating, or a combination of these processes. One or more traces are then stacked on the first trace. The one or more traces are formed using a process selected from the group including: laser embedded (LECS); transfer embedded (TECS); semi additive (SAP), e.g., electro less seed, sputter, laser activated dielectrics; full additive, e.g., full build copper plating, or a combination of these processes. Examples include formation of: LECS traces on SAP traces; LECS traces on LECS traces; SAP traces on LECS traces; SAP traces on LECS traces on LECS traces; LECS traces on SAP traces on LECS traces.

Figure 17:
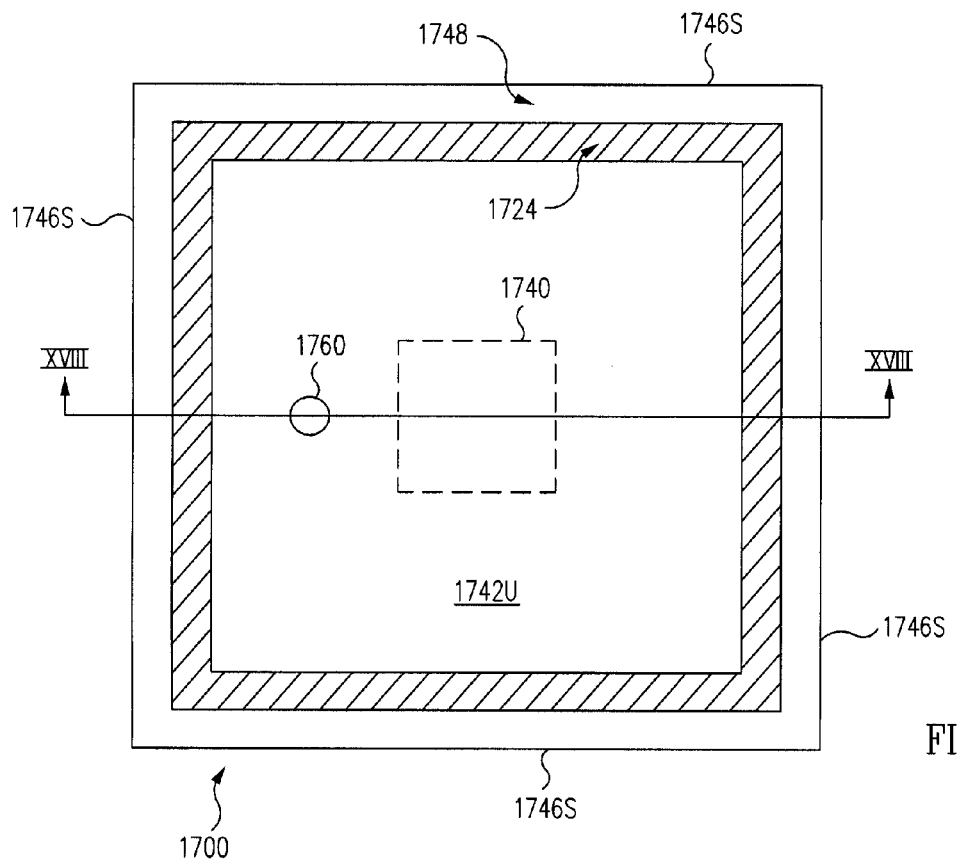
FIG. 17 is a top plan view of a stacked trace shielded electronic component package in accordance with one embodiment.
Figure 18:
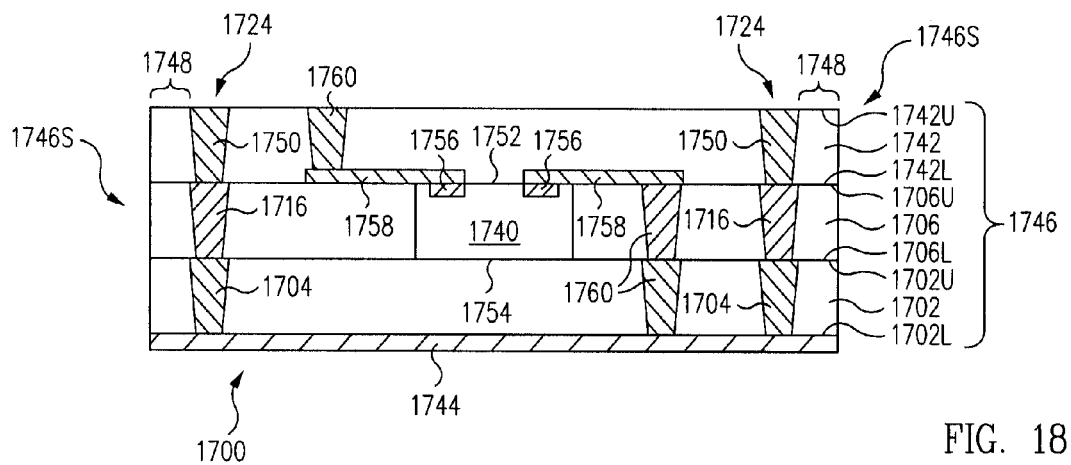
FIG. 18 is a cross-sectional view of the stacked trace shielded electronic component package of FIG. 17 along the line XVIII-XVIII in accordance with one embodiment.

FIG. 17 is a top plan view of a stacked trace shielded electronic component package 1700 in accordance with one embodiment. FIG. 18 is a cross-sectional view of stacked trace shielded electronic component package 1700 of FIG. 17 along the line XVIII-XVIII in accordance with one embodiment. Referring now to FIGS. 17 and 18 together, stacked trace shielded electronic component package 1700 includes a stacked trace 1724 that shields an electronic component 1740 from electromagnetic interference (EMI).

More particularly, stacked trace shielded electronic component package 1700 includes a dielectric layer 1702, a first buildup dielectric layer 1706, and a second buildup dielectric layer 1742. Dielectric layers 1702, 1706, 1742 include upper, e.g., first, surfaces 1702U, 1706U, 1742U and lower, e.g., second surfaces 1702L, 1706L, 1742L, respectively.

Formed on lower surface 1702L of dielectric layer 1702 is an electrically conductive plane 1744, e.g., a sheet of copper or other electrically conductive material. Lower surface 1706L of first buildup dielectric layer 1706 is mounted to upper surface 1702U of dielectric layer 1702. Lower surface 1742L of second buildup dielectric layer 1742 is mounted to upper surface 1706U of first buildup dielectric layer 1706.

Dielectric layers 1702, 1706, 1742 collectively form a stacked dielectric structure 1746. Stacked dielectric structure 1746 has a lower surface that is lower surface 1702L of dielectric layer 1702. Further, stacked dielectric structure 1746 has an upper surface that is upper surface 1742U of second buildup dielectric layer 1742. Stacked dielectric structure 1746 further includes sides 1746S extending between lower surface 1702L of dielectric layer 1702 and upper surface 1742U of second buildup dielectric layer 1742.

Stacked trace 1724 extends entirely through stacked dielectric structure 1746 between lower surface 1702L of dielectric layer 1702 and upper surface 1742U of second buildup dielectric layer 1742. Stacked trace 1724 extends around the entire periphery of stacked dielectric structure 1746 adjacent sides 1746S. When viewed from above as in the view of FIG. 17, stacked trace 1724 is a rectangular annulus. A small rectangular annulus 1748 of stacked dielectric structure 1746, i.e., of each of dielectric layers 1702, 1706, 1742, exists between stacked trace 1724 and sides 1746S of stacked dielectric structure 1746.

Stacked trace 1724 is formed of three traces 1704, 1716, 1750 stacked one upon another. Trace 1704 extends completely through dielectric layer 1702 between lower surface 1702L and upper surface 1702U of dielectric layer 1702.

Trace 1704 is electrically connected to plane 1744. Trace 1704 is formed in dielectric layer 1702 in a manner similar to that discussed above regarding the formation of trace 104 in dielectric layer 102 in regards to FIG. 11B. Further, trace 1704 and dielectric layer 1702 are similar in structure to trace 104 and dielectric layer 102 as discussed above in regards to FIG. 11B.

Trace 1716, sometimes called a first buildup trace, extends completely through first buildup dielectric layer 1706 between lower surface 1706L and upper surface 1706U of first buildup dielectric layer 1706. Trace 1716 is stacked on and thus electrically connected to trace 1704.

Trace 1716 is formed in first buildup dielectric layer 1706 and stacked upon trace 1704 in a manner similar to that discussed above regarding the formation and stacking of first buildup trace 1316 or first buildup trace 828 in first buildup dielectric layer 1106 and on trace 104 in regards to FIGS. 13, 16, respectively. Further, trace 1716 and first buildup dielectric layer 1706 are similar in structure to first buildup trace 1316 or first buildup trace 828 and first buildup dielectric layer 1106 as discussed above in regards to FIGS. 13, 16, respectively.

Trace 1750, sometimes called a second buildup trace, extends completely through second buildup dielectric layer 1742 between lower surface 1742L and upper surface 1742U of second buildup dielectric layer 1742. Trace 1750 is stacked on and electrically connected to trace 1716.

Trace 1750 is formed in second buildup dielectric layer 1742 and stacked upon trace 1716 in a manner similar to that discussed above regarding the formation and stacking of first buildup trace 1316 or first buildup trace 828 in first buildup dielectric layer 1106 and on trace 104 in regards to FIGS. 13, 16, respectively. Further, trace 1750 and second buildup dielectric layer 1742 are similar in structure to first buildup trace 1316 or first buildup trace 828 and first buildup dielectric layer 1106 as discussed above in regards to FIGS. 13, 16, respectively In one embodiment, electronic component 1740 is an integrated circuit chip, e.g., an active component. However, in other embodiments, electronic component 1740 is a passive component such as a capacitor, resistor, or inductor.

In accordance with this embodiment, electronic component 1740 includes an active surface 1752 and an opposite inactive surface 1754. Electronic component 1740 further includes bond pads 1756 formed on active surface 1752.

In accordance with this embodiment, electronic component 1740 is sandwiched between dielectric layer 1702 and second buildup dielectric layer 1742. Inactive surface 1754 is mounted to upper surface 1702U of dielectric layer 1702. Further, lower surface 1742L of second buildup dielectric layer 1742 is mounted to active surface 1752. Electronic component 1740 extends entirely through first buildup dielectric layer 1706 between upper surface 1706U and lower surface 1706L.

Bond pads 1756 are electrically connected to traces 1758 formed on upper surface 1706U of first buildup dielectric layer 1706. Traces 1758 are electrically connected to electrically conductive vias 1760. Vias 1760 extend through dielectric layers 1702, 1706, 1742.

For example, as illustrated at the right of electronic component 1740, vias 1760 electrically connects a trace 1758 to plane 1744 through dielectric layers 1706, 1702. As a further example, as illustrated at the left of electronic component 1740, a via 1760 electrically connected to a trace 1758 extends through dielectric layer 1742 facilitating connection to the via 1760 at upper surface 1742U of dielectric layer 1742.

Electronic component 1740 is shielded from the sides by stacked trace 1724. More particularly, stacked trace 1724 prevents electromagnetic radiation from the ambient environment from passing in through sides 1746S to electronic component 1740. Further, stacked trace 1724 prevents electromagnetic radiation from electronic component 1740 from passing out through sides 1746S and to the ambient environment. Stacked trace 1724 is sometimes called a shield fence around electronic component 1740 in accordance with this embodiment.

Further, electronic component 1740 is shielded from below by plane 1744. More particularly, plane 1744 prevents electromagnetic radiation from the ambient environment from passing in through lower surface 1702L to dielectric layer 1702. Further, plane 1744 prevents electromagnetic radiation from electronic component 1740 from passing out through lower surface 1702L and to the ambient environment. Generally, electronic component is located within a shielded compartment formed by plane 1744 and stacked trace 1724. Plane 1744 and stacked trace 1724 are also used for electrostatic discharge (ESD) from stacked trace shielded electronic component package 1700 in one embodiment.

As set forth above, plane 1744 is electrically connected to stacked trace 1724. In one embodiment, a reference voltage source, e.g., ground or power, is applied to plane 1744, sometimes called a ground layer, and stacked trace 1724.

Although a particular mounting of electronic component 1740 and electrical interconnection therewith by traces 1758 and vias 1760 is illustrated and discussed above, in light of this disclosure, it is understood that other mounting configurations for electronic component 1740 and other electrical interconnections therewith are used in other embodiments depending upon the particular electronic component 1740 and the desired signal routing.

As set forth above, electronic component 1740 is shielded by stacked trace 1724. In another embodiment, a trace structure is shielded by stacked trace 1724 as discussed below in reference to FIGS. 19 and 20.

Figure 19:
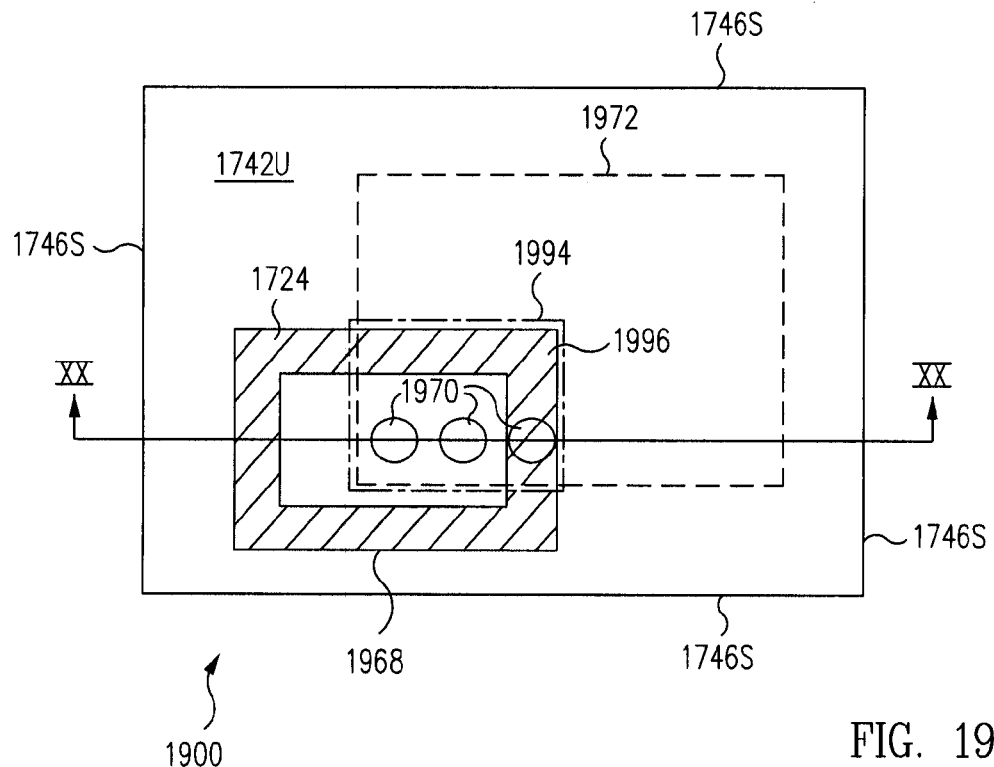
FIG. 19 is a top plan view of a stacked trace shielded electronic component package in accordance with one embodiment.
Figure 20:
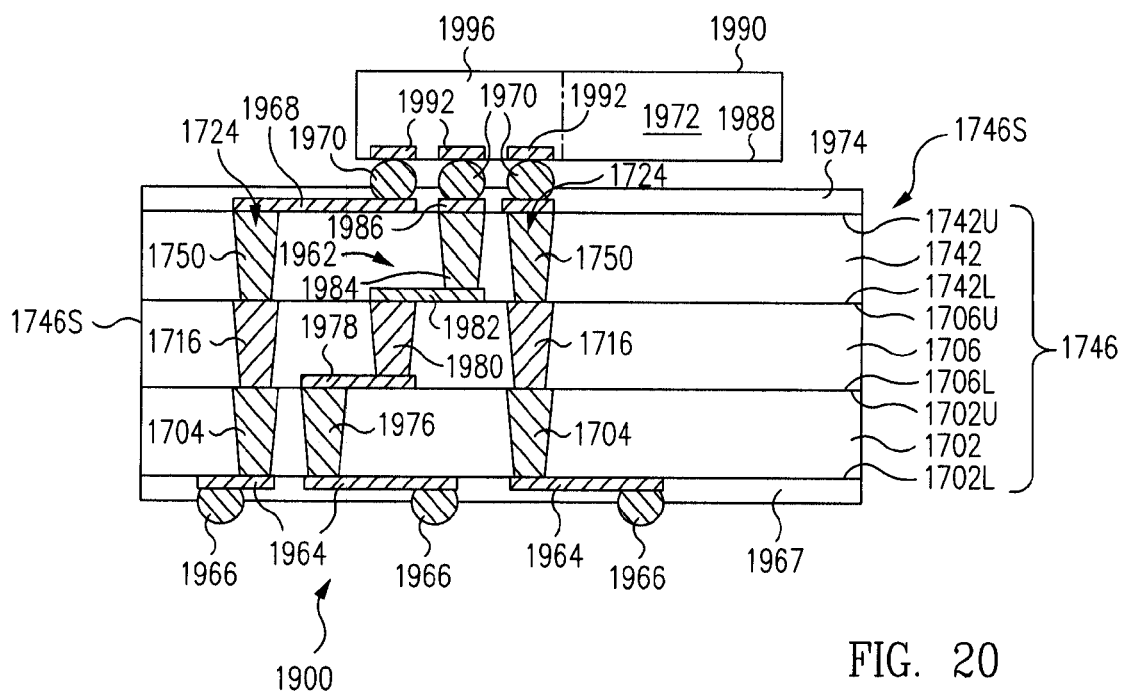
FIG. 20 is a cross-sectional view of the stacked trace shielded electronic component package of FIG. 19 along the line XX-XX in accordance with one embodiment.

FIG. 19 is a top plan view of a stacked trace shielded electronic component package 1900 in accordance with one embodiment. FIG. 20 is a cross-sectional view of stacked trace shielded electronic component package 1900 of FIG. 19 along the line XX-XX in accordance with one embodiment. Referring now to FIGS. 19 and 20 together, stacked trace shielded electronic component package 1900 includes stacked trace 1724 that shields a trace structure 1962 from electromagnetic interference (EMI). Shielding of trace structure 1962 is sometimes called signal isolation as it is the signal on trace structure 1962 that is shielded.

Stacked trace shielded electronic component package 1900 of FIGS. 19 and 20 is similar to stacked trace shielded electronic component package 1700 of FIGS. 17 and 18 and only the significant differences are discussed below.

Stacked trace shielded electronic component package 1900 includes dielectric layer 1702, trace 1704, first buildup dielectric layer 1706, first buildup trace 1716, second buildup dielectric layer 1742, stacked dielectric structure 1746, and second buildup trace 1750 similar or identical to dielectric layer 1702, trace 1704, first buildup dielectric layer 1706, first buildup trace 1716, second buildup dielectric layer 1742, stacked dielectric structure 1746, and second buildup trace 1750 of stacked trace shielded electronic component package 1700, respectively, and so the description is not repeated.

In accordance with this embodiment, lower traces 1964 are formed on lower surface 1702L of dielectric layer 1702. Lower traces 1964 are electrically connected to stacked trace 1724. In accordance with this embodiment, lower interconnection balls 1966, e.g., a ball grid array (BGA), are formed on lower traces 1964. Lower interconnection balls 1966 are used to electrically connect stacked trace shielded electronic component package 1900 to another structure such as a printed circuit motherboard. Optionally, a lower solder mask 1967 is formed over lower traces 1964 and lower surface 1702L of dielectric layer 1702 to protect lower traces 1964.

Further, an electrically conductive plane 1968 is formed on upper surface 1742U of second buildup dielectric layer 1742. Plane 1968 is electrically connected to stacked trace 1724. Stacked trace 1724 is illustrated as a shaded rectangular annulus in FIG. 19 although it is to be understood that stacked trace 1724 is below plane 1968 and would ordinarily not be visible in the view of FIG. 19.

In accordance with this embodiment, upper interconnection balls 1970, e.g., a ball grid array (BGA), are formed on plane 1968. Upper interconnection balls 1970 are used to electrically connect an electronic component 1972 to plane 1968 and thus to stacked trace 1724. Optionally, an upper solder mask 1974 is formed over plane 1968 and upper surface 1742U of second buildup dielectric layer 1742 to protect plane 1968.

Trace structure 1962 includes an electrically conductive structure extending through stacked dielectric structure 1746. In accordance with this example, trace structure 1962 includes a lower via 1976, a lower trace 1978, a middle via 1980, an upper trace 1982, an upper via 1984, and a terminal 1986.

Lower via 1976 is electrically connected to a lower trace 1964 and extends through dielectric layer 1702 to lower trace 1978. Lower trace 1978 is formed on upper surface 1702U of dielectric layer 1702 and extends along upper surface 1702U.

Middle via 1980 is electrically connected to lower trace 1978 and extends through first buildup dielectric layer 1706 to upper trace 1982. Upper trace 1982 is formed on upper surface 1706U of first buildup dielectric layer 1706 and extends along upper surface 1706U.

Upper via 1984 is electrically connected to upper trace 1982 and extends through second buildup dielectric layer 1742 to terminal 1986. Terminal 1986 is formed on upper surface 1742U of second buildup dielectric layer 1742. An upper interconnection ball 1970 is formed on terminal 1986.

An opening is formed in plane 1968. Terminal 1986 is formed in this opening and thus trace structure 1962 is electrically isolated from plane 1968 and stacked trace 1724.

In one embodiment, electronic component 1972 is an integrated circuit chip, e.g., an active component. However, in other embodiments, electronic component 1972 is a passive component such as a capacitor, resistor, or inductor.

In accordance with this embodiment, electronic component 1972 includes an active surface 1988 and an opposite inactive surface 1990. Electronic component 1972 further includes bond pads 1992 formed on active surface 1988. Electronic component 1972 is illustrated by the dashed rectangle in FIG. 19 to allow visualization of elements below electronic component 1972 that otherwise would not be visible.

Bond pads 1992 are electrically and physically connected to plane 1968 and terminal 1986 by upper interconnection balls 1970.

As indicated by the dashed dot rectangle 1994 in FIG. 19, electronic component 1972 includes a high frequency portion 1996, e.g., a Radio Frequency (RF) portion. High frequency portion 1996 emits a substantial amount of electromagnetic radiation.

Trace structure 1962 is shielded from electronic component 1972 by plane 1968 and stacked trace 1724, which form a shielded compartment around trace structure 1962. More particularly, trace structure 1962 is shielded from above by plane 1968 and from the sides by stacked trace 1724. Plane 1968 and stacked trace 1724 are also used for electrostatic discharge (ESD) from stacked trace shielded electronic component package 1900 in one embodiment.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A substrate comprising:
   a stacked trace comprising:
      a trace that comprises a first seed layer and a first metal layer and is formed directly on a top surface of a dielectric layer;
      a first buildup trace that is stacked on the trace and comprises:
         a second seed layer and a second metal layer each with generally the same width as the trace;
         a first top surface;
         a second bottom surface opposite the first top surface; and
         sidewalls extending between the first top surface and the second bottom surface and wholly within the width of the trace laterally; and
      a first buildup dielectric layer formed on the top surface of the dielectric layer and enclosing sides of the trace and the sidewalls of the first buildup trace.

2. The substrate of claim 1 further comprising a trace channel formed in the first buildup dielectric layer directly above the trace, the first buildup trace being formed in the trace channel.

3. The substrate of claim 1 wherein the first buildup trace is identical to the trace.

4. The substrate at claim 1 wherein the sidewalls are perpendicular to the first top surface and the second bottom surface of the first buildup trace.

5. The substrate of claim 1 wherein the sidewalls taper between the first top surface and the second bottom surface of the first buildup trace.

6. A substrate comprising:
   a stacked trace comprising:
      a trace embedded in a dielectric layer;
      a first buildup trace that is stacked on the trace and comprises:
         a cross-section that has generally the same width as the trace and wholly within the width of the trace laterally;
         a first top surface;
         a second bottom surface opposite the first top surface; and
         sidewalls extending between the first top surface and the second bottom surface; and
      a first buildup dielectric layer with a first bottom surface in contact with a top surface of the dielectric layer and enclosing the sidewalls of the first buildup trace, wherein no portion of the trace is above any portion of the first buildup trace.

7. The substrate of claim 6 wherein the dielectric layer comprises a second bottom surface, a portion of the dielectric layer existing between the trace and the second bottom surface of the dielectric layer.

8. The substrate of claim 6 wherein the dielectric layer comprises a second bottom surface, the trace extending entirely through the dielectric layer between the first top surface and the second bottom surface of the dielectric layer.

9. The substrate of claim 1 further comprising an unstacked trace.

10. A method comprising:
- providing, on a substrate, a dielectric layer comprising a first top surface;
- forming a trace that comprises a first seed layer and a first metal layer and is formed directly on the first top surface of the dielectric layer;
- stacking a first buildup trace on the trace, where the first buildup trace comprises:
  - a second seed layer and a second metal layer each with generally the same width as the trace and wholly within the width of the trace laterally;
  - a first top surface;
  - a second bottom surface opposite the first top surface; and
  - sidewalls extending between the first top surface and the second bottom surface; and
- forming a first buildup dielectric layer enclosing sides of the trace and the sidewalls of the first buildup trace, the first buildup dielectric layer comprising a first bottom surface in contact with the first top surface of the dielectric layer, the first buildup dielectric layer further comprising a second top surface coplanar with the first top surface of the first buildup trace, wherein no portion of the trace is above any portion of the first buildup trace.

11. The method of claim 10 wherein the stacking a first buildup trace on the trace comprises:
- enclosing the trace and the first top surface of the dielectric layer in the first buildup dielectric layer;
- forming a trace channel in the first buildup dielectric layer to expose the trace; and
- filling the trace channel with the first buildup trace.

12. The method of claim 10 wherein the stacking a first buildup trace on the trace comprises:
- enclosing a first surface of the trace and the first top surface of the dielectric layer in the first buildup dielectric layer;
- forming a trace channel in the first buildup dielectric layer to expose the trace; and
- filling the trace channel with the first buildup trace.

13. The method of claim 10 wherein the stacking a first buildup trace on the trace comprises:
- enclosing the trace and the first top surface of the dielectric layer in the first buildup dielectric layer; and
- transfer embedding the first buildup trace into the first buildup dielectric layer.

14. The substrate of claim 1 wherein the stacked trace forms a shielded compartment.

15. The substrate of claim 14 further comprising: an electronic component located within the shielded compartment.

16. The substrate of claim 14 further comprising: a trace structure located within the shielded compartment.

17. The substrate of claim 1, wherein the first buildup dielectric layer comprises a second top surface that is coplanar with the first top surface of the first buildup trace.

18. The substrate of claim 1, wherein no portion of the trace is above any portion of the first buildup trace.

19. The substrate of claim 1, wherein the second seed layer is U-shaped.

20. The substrate of claim 1, wherein the trace and first buildup trace are formed from an identical metal.

21. The substrate of claim 1, wherein the trace and the first buildup trace run in parallel along their entire respective longitudinal lengths.

22. The substrate of claim 6, wherein the first buildup dielectric layer comprises a second top surface that is coplanar with the first top surface of the first buildup trace.

23. The substrate of claim 6, wherein the trace comprises a seed layer and a metal layer formed on the dielectric layers.

24. The substrate of claim 6, wherein the first buildup trace comprises a second seed layer and a second metal layer formed on the metal layer.

25. The substrate of claim 6, wherein the trace and first buildup trace are formed from an identical metal.

26. The substrate of claim 6, wherein the trace and the first buildup trace run in parallel along their entire respective longitudinal lengths.

* * * * *